(12) United States Patent
Darwish et al.

(10) Patent No.: US 8,791,759 B2
(45) Date of Patent: Jul. 29, 2014

(54) BIPOLAR STACKED TRANSISTOR ARCHITECTURE

(75) Inventors: Ali Darwish, Laurel, MD (US); Thomas J. Farm, Washington, DC (US); Mona Zaghloul, Bethesda, MD (US)

(73) Assignees: The United States of America as Represented by the Secretary of the Army, Washington, DC (US); The George Washington University, Washington, DC (US)

( * ) Notice: Subject to any disclaimer, the term of this patent is extended or adjusted under 35 U.S.C. 154(b) by 47 days.

(21) Appl. No.: 13/427,311

(22) Filed: Mar. 22, 2012

(65) Prior Publication Data

US 2012/0242410 A1    Sep. 27, 2012

Related U.S. Application Data

(60) Provisional application No. 61/466,244, filed on Mar. 22, 2011.

(51) Int. Cl.
    *H03F 3/04* (2006.01)
(52) U.S. Cl.
    USPC .......................................................... 330/288
(58) Field of Classification Search
    USPC .................... 323/315, 316; 330/288; 327/530
    See application file for complete search history.

(56) References Cited

U.S. PATENT DOCUMENTS

| | | | |
|---|---|---|---|
| 4,705,967 A | 11/1987 | Vasile | |
| 4,994,758 A * | 2/1991 | Welty | 330/288 |
| 5,049,835 A | 9/1991 | Vasile | |
| 5,061,903 A | 10/1991 | Vasile | |
| 5,089,791 A | 2/1992 | Vasile | |
| 5,191,238 A | 3/1993 | Vasile | |
| 6,137,367 A | 10/2000 | Ezzedine et al. | |
| 6,414,553 B1 * | 7/2002 | Luo | 330/296 |
| 2012/0161876 A1 * | 6/2012 | Leong et al. | 330/288 |

OTHER PUBLICATIONS

A. Babakhani et al., "A 77-GHz Phased-Array Transceiver with On-Chip Antennas in Silicon: Receiver and Antennas," IEEE Journal of Solid-State Circuits, vol. 41, No. 12, pp. 2795-2806, Dec. 2006.
B. Floyd et al., "Silicon Millimeter-Wave Radio Circuits at 60-100 GHz," Proc. IEEE Topical Meeting on Silicon Monolithic Integrated Circuits in RF Systems, pp. 213-218, Jan. 2007.
J. Rieh et al., "Scaling of SiGe HBTs," Proc. of the IEEE, vol. 93, No. 9, pp. 1522-1538, Sep. 2005.
A. K. Ezzeddine et al., "The High Voltage/High Power FET (HiVP)," IEEE RFIC Symposium Digest, pp. 215-218, Jun. 2003.

(Continued)

*Primary Examiner* — Steven J Mottola
(74) *Attorney, Agent, or Firm* — Blank Rome LLP

(57) ABSTRACT

An amplifier for an integrated circuit has a plurality of ratioed current mirrors connected to each other in a stacked configuration. Each ratio mirror has at least two resistors and at least two bipolar transistors connected to each other via said at least two resistors. Each amplifying transistor, contains a capacitor, and potentially and inductor, to internally match the transistors that make up the amplifying stack. DC, harmonic and s-parameter simulations are performed to provide an optimal impedance for each of the stacked transistors to maximize the RF power output of each stacked layer and the amplifier.

24 Claims, 13 Drawing Sheets

(56) References Cited

OTHER PUBLICATIONS

L. Wu et al., "The Integrated 2W High Voltage/High Power 0.12-_m RF CMOS Power Amplifier," 12th GAAS Symposium—Amsterdam, pp. 451-454, 2004.

M. Lei et al., "Design and Analysis of Stacked Power Amplifier in Series-Input and Series-Output Configuration," IEEE Tran. on Microwave Theory and Techniques, vol. 55, No. 12, pp. 2802-2812, Dec. 2007.

H. Wang et al., "MMICs in the Millimeter-wave Regime," Microwave Magazine, IEEE, vol. 10, No. 1, pp. 99-117, Feb. 2009.

T. J. Farmer et al., "A 2.4 GHz SiGe HBT High Voltage/High Power Amplifier," Microwave and Wireless Components Letters, IEEE , vol. 20, No. 5, pp. 286-288, May 2010.

A. Komijani et al., "A 24-GHz, + 14.5-dBm fully integrated power amplifier in 0.18 μm CMOS," IEEE J. Solid-State Circuits, vol. 40, No. 9, pp. 1901-1908, Sep. 2005.

J. Kuo et al., "A 19.1-dBm Fully-Integrated 24 GHz Power Amplifier Using 0.18-μm CMOS Technology," Microwave Integrated Circuit Conference, 2008. EuMIC 2008. European, vol., No., pp. 558-561, Oct. 27-28, 2008.

H. Shigematsu et al., "Millimeter-Wave CMOS Circuit Design," Microwave and Wireless Components Letters, IEEE, vol. 53, No. 2,pp. 472-477, Feb. 2005.

T. J. Farmer, "Millimeter-Wave High Voltage Power Amplifier Implementation in Silicon Germanium", May 16, 2010.

T. J. Farmer et al., "High Voltage/High Power Amplifier Implementation with .12 um SiGe HBTs," Proceedings of the 2010 GOMAC-Tech—Government Microcircuit Applications and Critical Technology Conference Microelectronics for Net Enabled and Cyber Transformational Technologies, Reno, NV, Mar. 23-25, 2010.

T. J. Farmer et al., "Device Architecture for Millimeter-Wave Power Amplifiers using SiGe HBTs," Proceedings of the 2011 GOMAC-Tech—Government Microcircuit Applications and Critical Technology Conference Microelectronics for Net Enabled and Cyber Transformational 20 Technologies, Orlando, FL, Mar. 21-24, 2011.

T.J. Farmer et al., "SiGe HBT Stacked Power Amplifier at Millimeter-Wave," Proceedings of the 2011 GOMAC-Tech—Government Microcircuit Applications and Critical Technology Conference Microelectronics for Net Enabled and Cyber Transformational Technologies, Orlando, FL, Mar. 21-24, 2011.

T.J. Farmer et al., "Millimeter-wave SiGe High Voltage/High Power Architecture Implementation," Microwave and Wireless Components Letters, IEEE, vol. 21, No. 10, pp. 544-546, Oct. 2011.

T.J. Farmer et al., "High Power Density SiGe Millimeter-Wave Power Amplifiers," International Journal of Microwave and Wireless Technologies, vol. 3, No. 6, pp. 615-620, Dec. 2011.

* cited by examiner

BIPOLAR STACKED TRANSISTOR ARCHITECTURE

RELATED APPLICATIONS

This application claims the benefit of U.S. Provisional Application No. 61/466,244, filed Mar. 22, 2011, the entire content of which is incorporated herein by reference.

BACKGROUND OF THE INVENTION

1. Field of the Invention

The present invention relates to a transistor architecture and simulation technique for optimizing the transistor architecture. More particularly, the present invention is for an architecture having stacked bipolar transistors for a high power amplifier, and a simulation technique for maximizing the transistor RF power output.

2. Background of the Related Art

Recently, the FCC has made several large commercially available allocations of the bandwidth in the millimeter-wave communication bands, namely the V-band (59-64 GHz), E-bands (71-76 GHz & 81-86 GHz), and the W-band (92-95 GHz). Integrated circuit technology that is both mature and capable of operating at these very high millimeter-wave frequencies is known as III-V based integrated circuit technology. See Federal Communications Commission, "FCC 05-45—WTB Allocations and Service Rules for the 71-76 GHz, 81-86 GHz, and 92-95 GHz Bands," Rep. FCC 05-45, URL: http://hraunfoss.fcc.gov/edocs_public/attachmatch/FCC-05-45A1.pdf, 2005, the contents of which are hereby incorporated by reference. Until the allocations made by the FCC, use of the millimeter-wave communication bands was limited to those with the defense and aerospace industries. Due to this historically limited use of the millimeter-wave frequencies, III-V based integrated circuit technologies have remained dominant as they fit the low volume requirements of the defense and aerospace industries. However, due to low volume production, they have also remained expensive.

Silicon-based integrated circuit technologies, long dominant in the digital computer industry, have enjoyed inexpensive production costs due to the mass volume of production. The continued advance in the speed of digital computers has advanced a key metric that determines the speed of the silicon-based integrated circuit's transistor, known as the $f_T/f_{MAX}$ (frequency of unity gain/maximum frequency of operation). Currently, silicon-based transistors have reached near parity with III-V based integrated circuit technologies in terms of the $f_T/f_{MAX}$ metric. While silicon-based integrated circuits are essentially 'as fast as' III-V-based integrated circuits, because they are optimized for digital behavior and not analog behavior as III-V-based technologies are, they do not match III-V's in terms of a second key metric: RF output power.

However, with the recent allocations made by the FCC, large research efforts have been undertaken to use commercially available, low cost silicon-based integrated circuit technology for millimeter-wave communications over high cost III-V-based integrated circuit technology. The research efforts focus on the idea that low RF (Radio Frequency) output power of the silicon-based technology could be overcome through creative circuit design, instead of modifying the way silicon-based technology is fabricated. See J. D., Cressler, "SiGe HBT Technology: A New Contender for Si-Based RF and Microwave Circuit Applications," Microwave Theory and Techniques, IEEE Transactions on, vol. 46, no, 5, pp. 572-589, 1998, the contents of which are hereby incorporated by reference. Coupling creative circuit design to increase the RF output power of the silicon-based integrated circuit's transistors, harnessed with the existing large manufacturing base for silicon and its existing high speed $f_T/f_{MAX}$, transistors, one could create a low-cost alternative to III-V technology ushering in a new era of commercial millimeter-wave communications, imaging, and radar products.

At the heart of any communication, imaging or radar system lies a transmitter and receiver. The transmitter is responsible for taking the information needed for transmission and amplifying it for broadcast. The component internal to all transmitters responsible for the final amplification of the signal for broadcast is known as the power amplifier. Commonly integrated circuit technology is used to implement both the transmitter and receiver. When an integrated circuit technology that incapable of generating large amounts of RF output power to create the transmitter's power amplifier, the transmitter will have a limited distance that it can 'transmit' the broadcast signal. Integrated circuit technology contains two main types of internal transistor topologies: FETs (Field Effect Transistors) and BJTs (Bipolar Junction Transistors). In an effort to obtain higher speed integrated circuit transistors, to increasing the $f_T/f_{MAX}$, the transistor can be made smaller, so that the electrons and holes, referred to as the 'charge carriers', that carry the signal through the transistor have less distance to travel and are therefore faster. A technique known as process scaling, among other techniques, is typically employed to achieve a smaller, faster transistor, FET devices contain a 'channel' that the electrons flow down and that channel can be shortened in the scaling process. BJT devices contain a component known as a base that electrons must travel through to traverse the device, so reducing its width through scaling will increase its $f_T/f_{MAX}$. Scaling in the form of shortening channel length for FETs or base width for BJT devices, to decrease carrier transit time, has a side effect. It reduces the amount of voltage one can safely apply across the transistor (FET or BJT) before it is destroyed or 'broken-down'. As $f_T/f_{MAX}$ is increased from one generation of transistors to the next, the breakdown voltage of the transistor is reduced from one process generation to the next [3]. Reduced breakdown voltages effectively decrease the RF output voltage swing and output impedance of transistors. For a transmitter's power amplifiers made from such devices, this results in reduced RF output power and requires more complex circuitry to allow it to operate in a transmitter/receiver system.

A commonly used technique to increase RF output power is to place transistors in parallel, which increases the output current swing of an amplifier, but reduces the output impedance. This makes input and output impedance matching more difficult for the designer. A less commonly used technique is device stacking; of which cascoding is an example. An original device stacking technique known as the HiVP (High Voltage/High Power) configuration offers a unique approach that not only allows the designer to customize the DC bias of their to amplifier, like a cascode, but increases the output voltage swing, improves efficiency, and raises the output impedance, greatly simplifying matching. Originally implemented in GaAs FETs [4], it has recently been implemented using Silicon FETs [5] and InGaP HBTs [6]. In this work we used the original HiVP architecture, provided a novel biasing technique, and extended it for use with BJTs.

SUMMARY OF THE INVENTION

Two-, three-, and four-stage BJT-based High Voltage/High Power (HiVP) amplifiers are designed, implemented, and measured. The HiVP is a circuit configuration that allows for very large output voltage swings, leading to high output power when used in a power amplifier. This invention marks the first implementation of a HiVP circuit using BJTs; in this specific work, Silicon Germanium (SiGe) Heterojunction Bipolar Transistors (HBTs) have been used, which are a type of BJT. The intent of this invention is 1) to illustrate practical design steps for implementing a HiVP circuit in BJT technologies and 2) to show a two proofs-of-concept using SiGe HBT at 2.4 GHz and 30 GHz. Frequencies that prove the usefulness of the BJT-based HiVP at today's commercial communication frequencies (2.4 GHz is common in WiFi, Bluetooth, cellular technology) and tomorrows millimeter-wave frequencies (30 GHz is the beginning of the millimeter-wave frequency band which ranges from 30 GHz to 300 GHz).

Two 2.4 GHz implementations have been designed, simulated, and fabricated and measured in 0.12 μm SiGe. At 2.4 GHz, Psat=16.67 dBm and Psat=18.55 dBm are achieved for the two- and three-stage SiGe-HBT HiVP amplifiers, respectively. At 30 GHz, a four-stage SiGe HBT HiVP has been designed, simulated, fabricated, and measured to have $P_{SAT}$=19.0 dBm with a PAE of 11.47% in an area of 0.21 mm². This architecture provides a new tool for silicon designers to design high output power for amplifier based components (power amplifiers, low to noise amplifiers, variable gain amplifiers, small signal amplifiers), customizable bias, and a way to minimize, if not eliminate, matching circuitry at millimeter-wave frequencies for BJT amplifier components in any technology (silicon-based or even III-V based). Simulation, layout, fabrication, and measurement results are presented.

The invention is an integrated circuit amplifier configuration that stacks bipolar transistor devices in both DC and RF series and provides a single bias source for all the devices in the stack. The result is an increase of both DC bias and RE output power; two highly beneficial properties in the design of an integrated circuit power amplifier. This invention has been created and marks the first application of this architecture in Silicon and in particular, Silicon Germanium at 2.4 GHz and 30 GHz frequencies.

The invention: (1) Allows high bias voltages for bipolar devices while protecting the devices from breakdown. (2) Allows for high RF output voltage swings leading to high RF output power. (3) Single source of bias for all transistors in design. It can be used to increase RF output power for any bipolar circuit technology; example implemented was to create a high RF output power amplifier by stacking several low power Silicon Germanium (SiGe) Heterojunction Bipolar Transistors (HBTs) in this new circuit configuration. Immediate implementations include Power Amplifier Component for Radar at millimeter-wave, Microwave/Millimeter-wave communication systems, millimeter-wave imaging systems.

The circuit configuration includes: (4) The use of bipolar transistor devices over field effect transistor (FET) devices used in present technology. (5) The use of a ratioed-current mirror to provide: DC bias, prevent breakdown of the bipolar devices in the main stack, and provide negative RF feedback to the amplifiers.

DETAILED DESCRIPTION OF THE PREFERRED EMBODIMENTS

In describing the preferred embodiments of the present invention illustrated in the to drawings, specific terminology is resorted to for the sake of clarity. However, the present invention is not intended to be limited to the specific terms so selected, and it is to be understood that each specific term includes all technical equivalents that operate in a similar manner to accomplish a similar purpose.

Figures 1A, 1B:
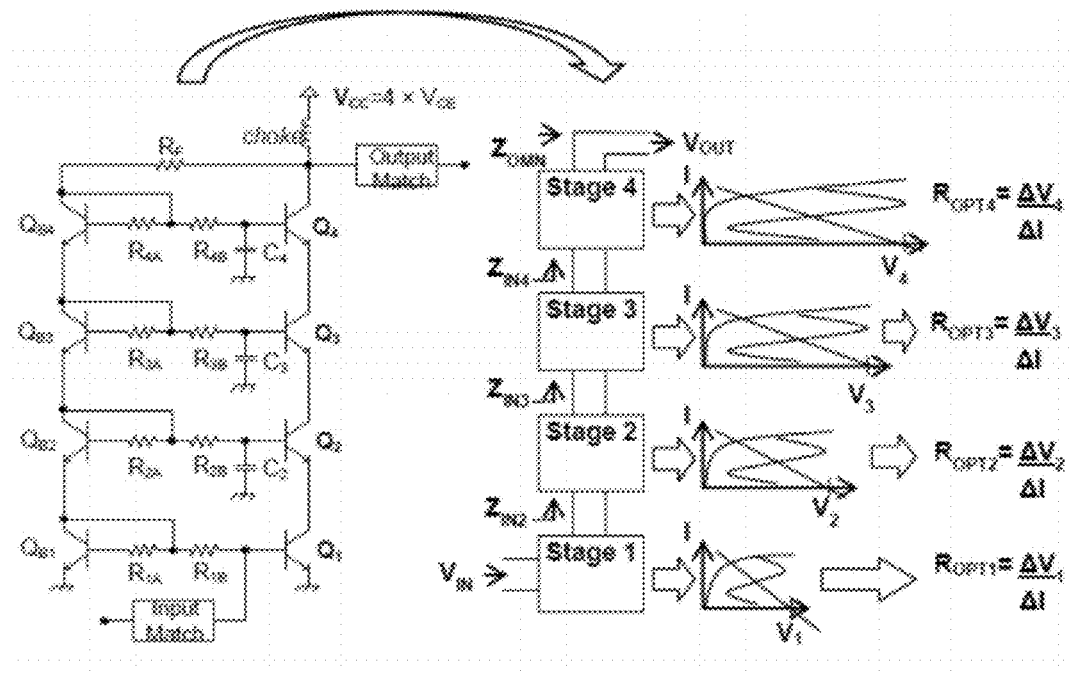
FIGS. 1(a)-(c) are schematic diagrams of a four Stage HiVP where HBT devices are in series both in de and RF.

The implementation of FIGS. 1(a), (b) use a stack of four Bipolar Transistors, Q1-Q4. Q1-Q4 are identical in emitter area size. The supply voltage (VCC) is set to four times a single transistor's supply voltage (VCE) or bias value. The Bipolar transistor labeled QB1, along with resistors R1A and R1B, serves as a ratioed current mirror for bipolar transistor Q1; this is true for QB2-4 for Q2-Q4 as well. Resistor labeled: RF serves a dual purpose: negative feedback and variable DC bias control. As the RF output signal swings up and down, resistor, RF changes the reference current to each current mirror. This adjusts the base current to each Q1-4, preventing device breakdown—a key and necessary feature of this configuration.

From an RF perspective, Q1-Q4 behave as an RF power combiner. RF enters through the base of Q1, travels up the stack of bipolar transistors, and exits through Q4's collector. What differentiates this configuration from a classic cascade configuration is the creation of optimum power match conditions for each transistor. Capacitors C2-C4 enable the designer to tune the input impedance of each bipolar transistor's emitter. By tuning the capacitor on the base of a bipolar transistor, the optimal load impedance can be presented to the preceding bipolar transistor's collector.

The advantages and novelty of this circuit configuration include: (1) The use of bipolar transistor devices over field effect transistor (FET) devices used in present technology. With bipolar transistors, greater output power levels can be achieved in the same area previously occupied by FET devices. (2) The use of a ratioed-current mirror to provide: DC bias, prevent breakdown of the bipolar devices in the main stack, and provide negative RF feedback to the to amplifiers. (3) The use of this circuit at millimeter-wave frequencies.

2.4 GHz SiGe HBT High Voltage/High Power Amplifier
SiGE HBT-HiVP Concept

Figure 1C:
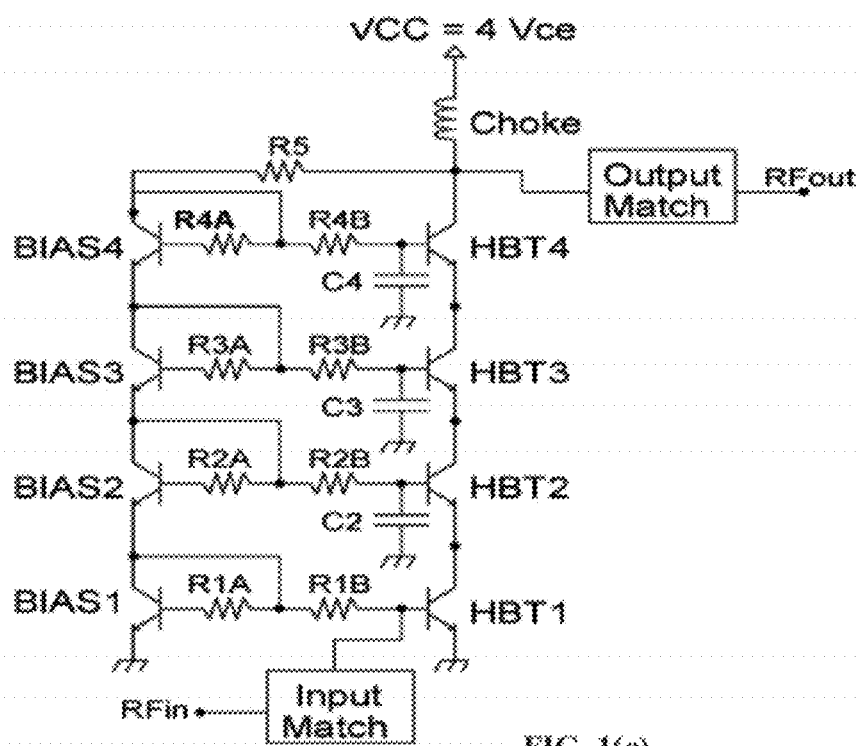

FIG. 1(c) shows an HiVP implementation using a stack of four SiGe HBTs. HBTs 1-4 are identical in emitter area size. VCC is set to four times a single transistor's VCE bias value. The HBT labeled BIAS1, along with resistors R1A and R1B, serves as a ratioed current mirror for HBT1; this is true for BIAS 2-4 for HBTs 2-4 as well. R5 serves a dual purpose: negative feedback and variable DC bias control. As the RF output signal swings up and down, R5 changes the reference current to each current mirror. This adjusts the base current to each HBT 1-4, preventing device breakdown—a key and necessary feature of the SiGe HBT-HiVP configuration.

From an RF perspective, HBTs 1-4 behave as an RF power combiner. RF enters through the base of HBT1, travels up the stack of HBTs, and exits through HBT4's collector. What differentiates this configuration from a classic cascode configuration is the creation of optimum power match conditions for each transistor. Capacitors C2-C4 enable the designer to tune the input impedance of each HBT's emitter. By tuning the capacitor on the base of an HBT, the optimal load impedance can be presented to the preceding HBT's collector. The relationship between a capacitor at the base of an HBT and its effect on the HBT's small signal emitter impedance is derived from Ezzeddine and Wu [4-5] through the following equation:

$$Z_{emitter} \approx \left(\frac{1}{g_m}\right)\left(1 + \frac{C_{be}}{C_{base}}\right) \quad (1)$$

Equation (1) shows that by adjusting a capacitor attached to the base of an HBT, the emitter's impedance can be altered. Thus, the larger the value of $C_{base}$, the smaller the emitter's impedance of transistor HBT2 will be. The goal is to adjust $C_{base}$ so that the emitter's impedance to becomes the optimal load impedance for the preceding HBT's collector. Thus, RF power can be transferred from one HBT stage to the next, effectively using the stack of HBTs as an RF power combiner,

Two Stack HiVP Simulation & Design

However, equation (1) only provides a rough estimate of value for $C_{base}$ that would provide the optimal load impedance. And, it presumes that the optimal load impedance is known. To overcome this as will be set forth more fully below, the invention starts with a single transistor (not the whole stack). In a first step, a DC simulation is performed by plotting an IV curve (FIG. 2(b)) for a single transistor (FIG. 2(a)). This allows the designer to determine the exact voltage to bias the transistor (i.e., to turn it on in a linear (class A) mode). In a second step, once the bias voltage is determined a harmonic balance simulation is performed and its results are overlaid on top of the IV curve from above (FIG. 3(b)). The load $Z_{OPT1}$ (FIG. 3(a)) attached to the transistor is adjusted until the ellipse consumes the entire IV-curve. This indicates the exact load that HBT1 wants to see at its collector $Z_{OPT1}$. If this load is supplied to that transistor, the maximum voltage and current swing will be reached by HBT1.

In a final third step, the appropriate $C_{base}$ must be determined to make HBT2 look like $Z_{OPT1}$ for the first transistor. An S-parameter simulation is performed (FIG. 4(a)) by doubling the $Z_{OPT1}$ of the first transistor ad attaching it to the second transistor. A variable $C_{base}$ (C2 in FIG. 1) is connected to the second transistor and a test setup is used to determine $Z_{emitter}$ for the second transistor. The s-parameter simulation is then run and $C_{base}$ is tuned until the s-parameter simulation indicates that $Z_{emitter}$ is the exact value of $Z_{OPT1}$ (from the second step).

At this point, the two transistors can be stacked, putting HBT2 on top of HBT1. Now to that $C_{base}$ on HBT2 has been determined, the emitter impedance of HBT2 is a match to HBT1's collector, so that they are RF matched. The system returns to step 1 to run a new DC simulation, treating the two stacked up transistors as if they were one larger sized transistor. Steps 1-3 are then repeated to determine C3 and so on until the desired stack size is obtained for the amount of RF power output desired for the amplifier. Thus, by finding the exact complex load that the transistors internal to the stack want to see, their optimal impedance is determined. Each transistor in the stack looks like the optimal impedance for the previous transistor in the stack. Thus, each transistor will transfer its maximum RF power to the next transistor in the stack and ultimately out of the amplifier.

As a proof of concept, two-, three-, and four-stack BJT HiVP devices were designed, fabricated, and measured. This section discusses the design and simulation technique used for the two-stack implementation, which was then expanded for the three-stack implementation; additional stages (like a fourth-stack or five-stack) could then be added using this technique. To properly size the devices in the HiVP, a mixture of DC, harmonic balance, and S-parameter simulations are used, iteratively.

DC Simulation—IV Curves and Initial Calculations

Figure 2A:
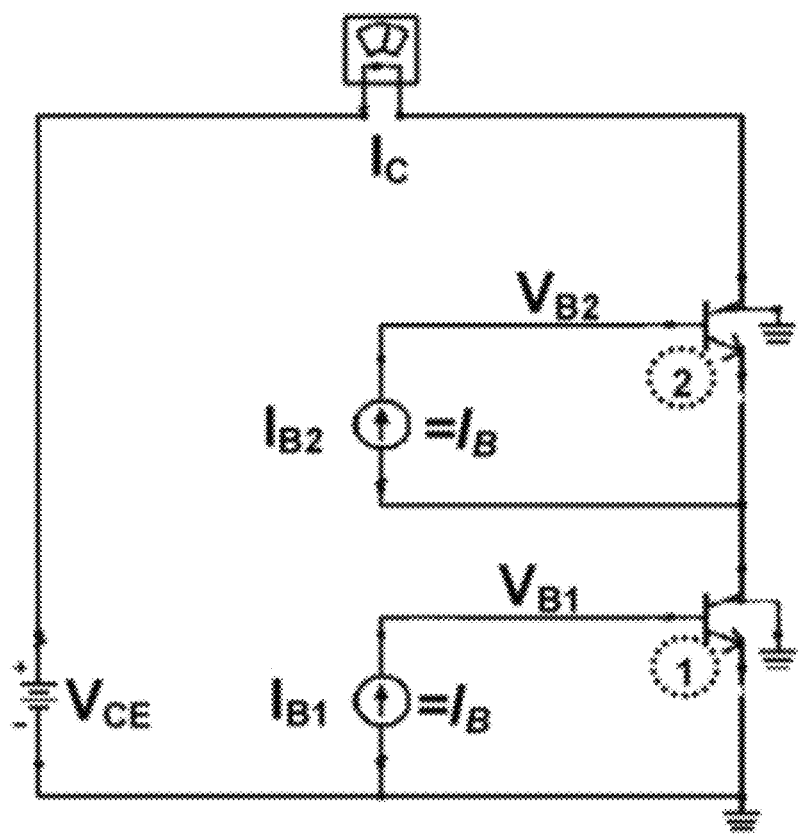
FIG. 2(a) is a circuit diagram of two Stack doubles IV-Curve's.
Figure 2B:
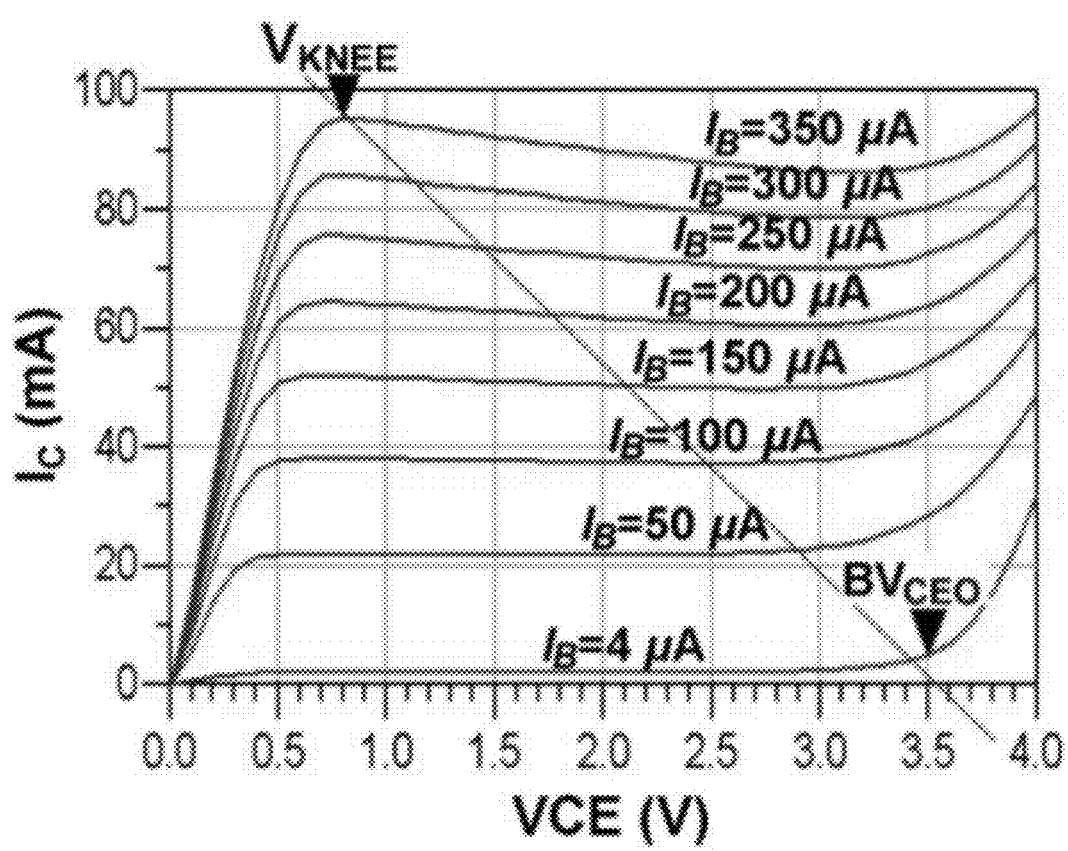
FIG. 2(b) is a diagram of the C-E breakdown ($BV_{CEO}$) for the circuit diagram of FIG. 2(a).

The first step of the design process is to generate an IV-Curve (IC vs. VCE) for a two HBT stack. The unusual configuration shown in FIG. 2a is used to generate the IV-Curves in FIG. 2b. The key to this simulation is to have the bottom terminal of the current source, supplying the second HBT, tied to the first HBT's collector as opposed to ground. This allows the voltage of the top HBT's base to be VB2=VBE2+VCE1 at all times during the DC simulation. The current sources are set to a common variable name (IB), so that each device's base current remains the same for each parametric sweep. FIG. 2(b) shows the two HBT's BVCEO=3.5 V nearly doubling a single HBT's BVCEO of only 1.8 V. The IV-curves of a single HBT are shown in FIG. 3(b).

Harmonic Balance—Determining Optimal Impedances

Next we determine the optimal load impedance for the first stage of the HiVP stack (the bottom HBT). From the IV-curve, the DC load line estimates ROPT1≈30Ω for a single four-finger HBT. A harmonic balance simulation is used to determine the optimal load's reactive component and more precisely determine ROPT1.

Figure 3A:
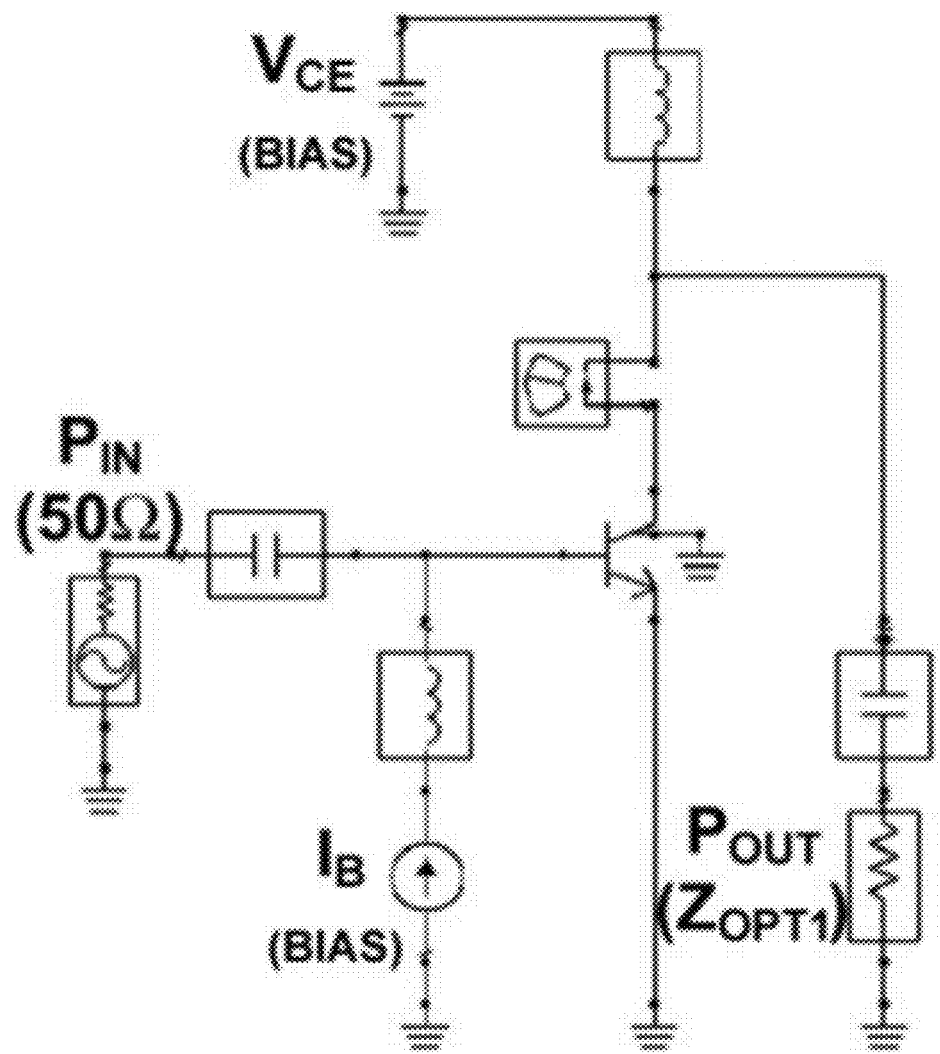
FIG. 3(a) is a circuit diagram of a bottom Stage of HiVP.
Figure 3B:
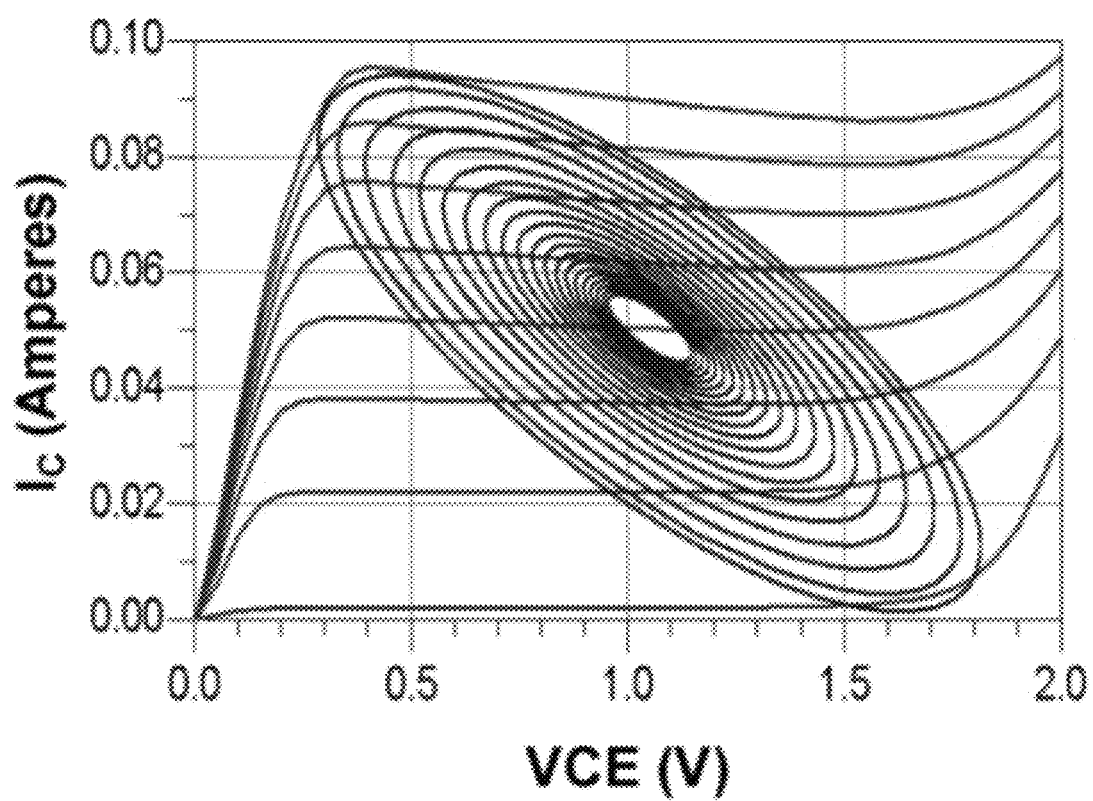
FIG. 3(b) shows the H.B. dynamic load line for the circuit diagram of FIG. 3(a).

The bottom HBT is configured as shown in FIG. 3(a). An RF signal at 2.4 GHz (center frequency of interest) is applied to the base; the input power of the 2.4 GHz signal is swept into compression (−20 dBm to 5 dBm), allowing the device to range from its linear region of operation into saturation. The DC bias for a single transistor is set for class AB operation (in our case, VCE=1.05 V, IB=157 μA). RF choke inductors and DC blocking capacitors are shown in boxes in FIG. 3(a). The load attached to the collector of the device is set as a tunable variable, ZOPT1=ROPT1+j*ZIMG1; initially ROPT1=30Ω, while ZIMG=0.

FIG. 3(b) shows the results of a tuned harmonic balance simulation overlaid with the results of a DC simulation for a single HBT. The elliptical pattern is known as a dynamic load-line, which is a Fourier transformed plot of the RF output power of the HBT overlaid on the DC IV-curve for the HBT; each ellipse corresponds to a single step of the swept input power. The designer can adjust the variable ROPT1 and ZIMG1 until the ellipse fills the entire DC IV-curve. An ellipse reaching the boundaries of the IV-curve indicates that the load presented to the device yields the maximum output voltage and output current swing. One must also ensure that the load presented ensures the highest PAE of the device for the class of operation. The load of ZOPT1=12.5+j11.5Ω produces the ellipse shown in FIG. 3(b) for a single SiGe HBT.

S-Parameter Simulation

Using (1), the goal is to make the input impedance of the second stage equal ZOPT1. An S-parameter simulation is performed on the second stage of the HiVP to determine its emitter impedance, as shown in FIG. 4(a).

Figure 4A:
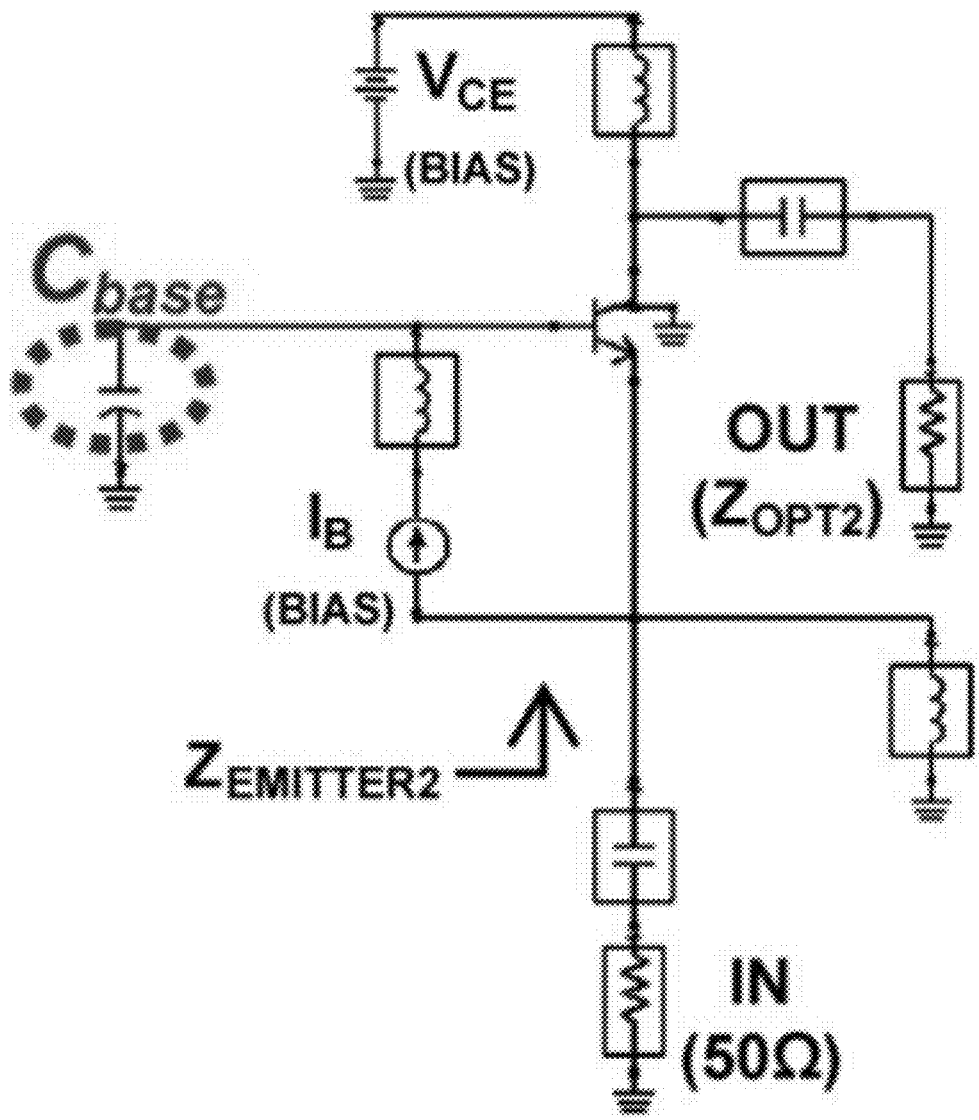
FIG. 4(a) is a circuit diagram of the S-parameter test bench for second stage of two-stack HiVP.

FIG. 4(a) shows the top stage of the 2 stack HiVP device. An input terminal is placed at the emitter (as port 1), and a second terminal (as port 2) is attached to the device's collector. The optimal impedance of the second stage is estimated at twice the first stage's optimal load (ZOPT2≈2*ZOPT1=25+j23Ω). This serves as a valid first order approximation and will be refined in a harmonic balance simulation. The DC bias found in DC simulation is applied to the transistor (VCE=1.05 V, IB=157 μA), RF chokes and DC blocks are added as shown.

In this simulation, Cbase is attached to the base of the HBT, as shown in FIG. 4(a) and is initially set to 0 F. A Smith chart plot of S11 reveals that as Cbase is increased, the emitter's input impedance ZEMITTER2 (at 2.4 GHz) decreases from 32.7+j7.2Ω to 12.6+j11.7Ω, as (1) predicts. With Cbase tuned, ZEMITTER2≈ZOPT1, so the second stage is now equal to the optimal impedance for the first stage. The two stages can be interconnected, as they are now optimally matched.

Harmonic Balance—Stacking of Stages

The final step is to interconnect stage 1 and the tuned stage 2 of the HiVP. As done for a single HBT, a harmonic balance simulation is performed to find the optimal load impedance (ZOPT2) that must be presented to the two-stage stack.

Figure 4B:
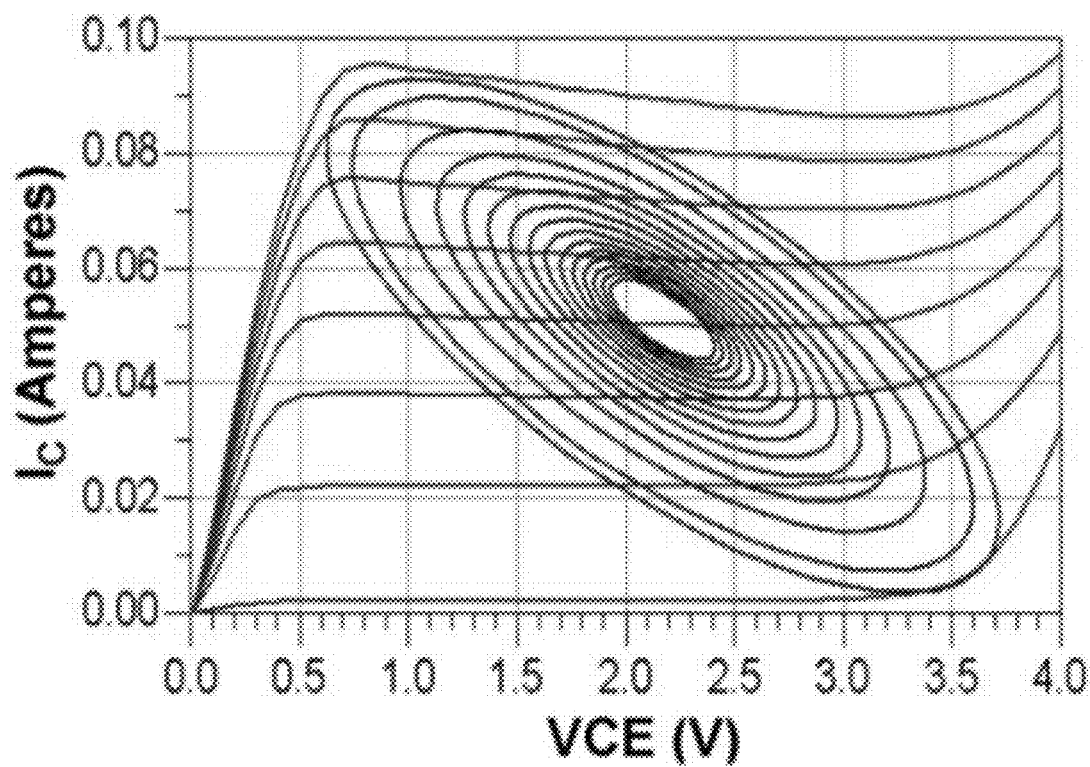
FIG. 4(b) shows the harmonic balance dynamic load line for two-stack HiVP.

Once the optimal impedance for the two-stage HiVP is determined, the simulations are repeated. Because the HBTs are non-unilateral, ZOPT2 changes emitter impedance of the second stage, so prior simulations for the second stage must be repeated to properly find Cbase. FIG. 4(b) shows the dynamic load line for a properly matched two-stack device.

Due to the sensitivity of the SiGe HBT to base-emitter voltage, resistor ratioed current mirrors replace the ideal current sources used in simulation. Ratioed mirrors allow one to use smaller HBTs for BIAS 1-4 in FIG. 1. The size of R5 is determined by calculating the DC supply current needed in the bias stack. Attention in layout is required to keep the feedback path through the bias stack to a fraction of the wavelength of interest, to avoid any potential phase-shifts in the HiVP stack. The simulator was used to verify that R5 provides the correct bias current and that the phase of feedback path phase is small.

Measurements

Figure 5:
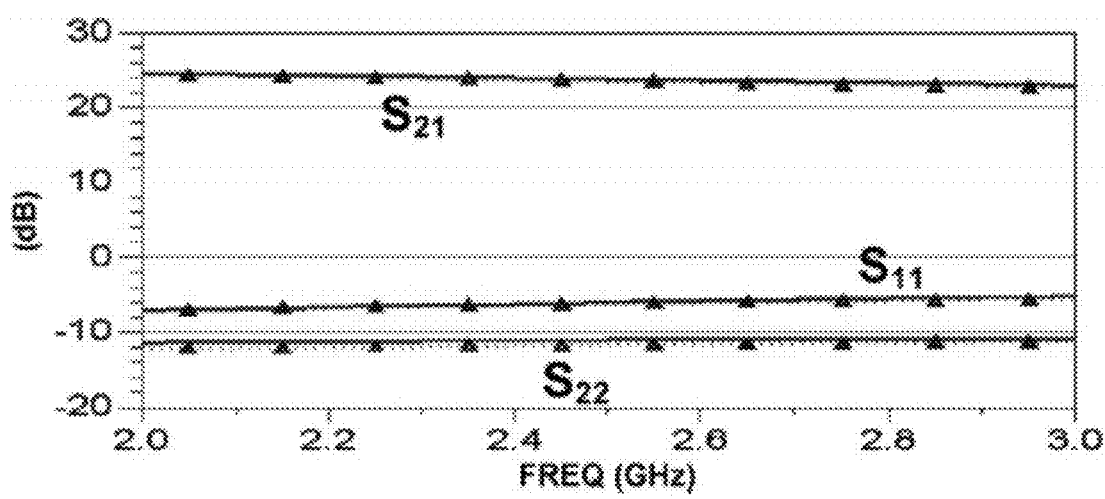
FIG. 5 is a diagram showing the S-parameters-unmatched-2 stack HiVP (sim. versus mes.).
Figure 6:
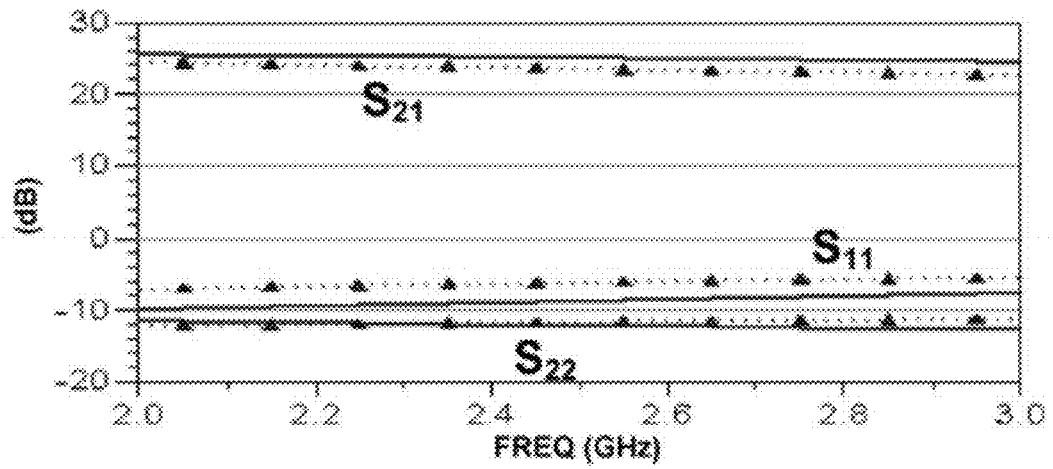
FIG. 6 is a diagram showing the S-parameters-unmatched-3 stack HiVP (sim. versus mes.).

Both two- and three-stack HiVPs have been fabricated using the IBM 8HP SiGe HBT 0.12 μm process, and have been measured. The total layout area for the two-stack=0.013 mm2; the area for the three-stack=0.016 mm2. For the two- and three-stack devices, supply voltage (VCC) is 2.17 V and 3.2 V, respectively. S-parameters for the unmatched two- and three-stack devices are shown in FIGS. 5 and 6, respectively. Large signal characteristics, for both devices, are in FIG. 7.

Figure 7:
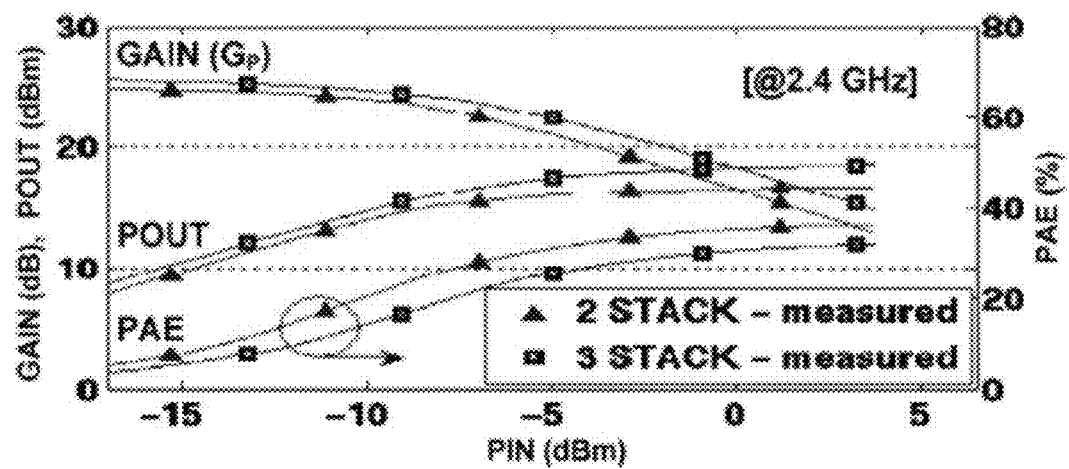
FIG. 7 is a diagram of $P_{sat}$=6.67 dBm, $P_{sat}$=18.55 dBm, 2&3 stack HiVP resp. (mes.).

The measurements show a strong agreement with simulated values, as a variance of only 1.5 dB is observed. The power measurements in FIG. 7 show a more than 50% increase in Psat with the addition of the third stage—a big benefit for a small increase in area, it is important to note that a large transistor of similar total periphery would have a narrower bandwidth, S11 and S22 would not be as flat across the band, and Zout would be much lower. Due to success at low frequencies, SiGe HBT-HiVP two-, three-, and four-stage mm-wave implementations have been designed and sent out for fabrication.

Millimeter-Wave SiGe HBT High Voltage/High Power Architecture Implementation

The architecture and simulation shown and described with respect to FIGS. 1-7 above can be utilized in a wide variety of configurations. For instance, the architecture and simulation can be used at any frequency, such as 2.4, 5, 30, 60, 77, 94 GHz, etc., and in any technology (not just the SiGe as above). A non-limiting illustrative example of the invention will now be discussed with respect to FIGS. 8-13, with the architecture implemented at 30 GHz. However, one skilled in the art will appreciate that additional embodiments are suitable within the spirit and scope of the invention, such as those described in papers [8], [12], [13], [14], [15], [16], [17], all of which are herein incorporated by reference. These papers discuss the 2.4 and 30 GHz implementations.

SiGe HBT HiVP Concept

Figure 8:
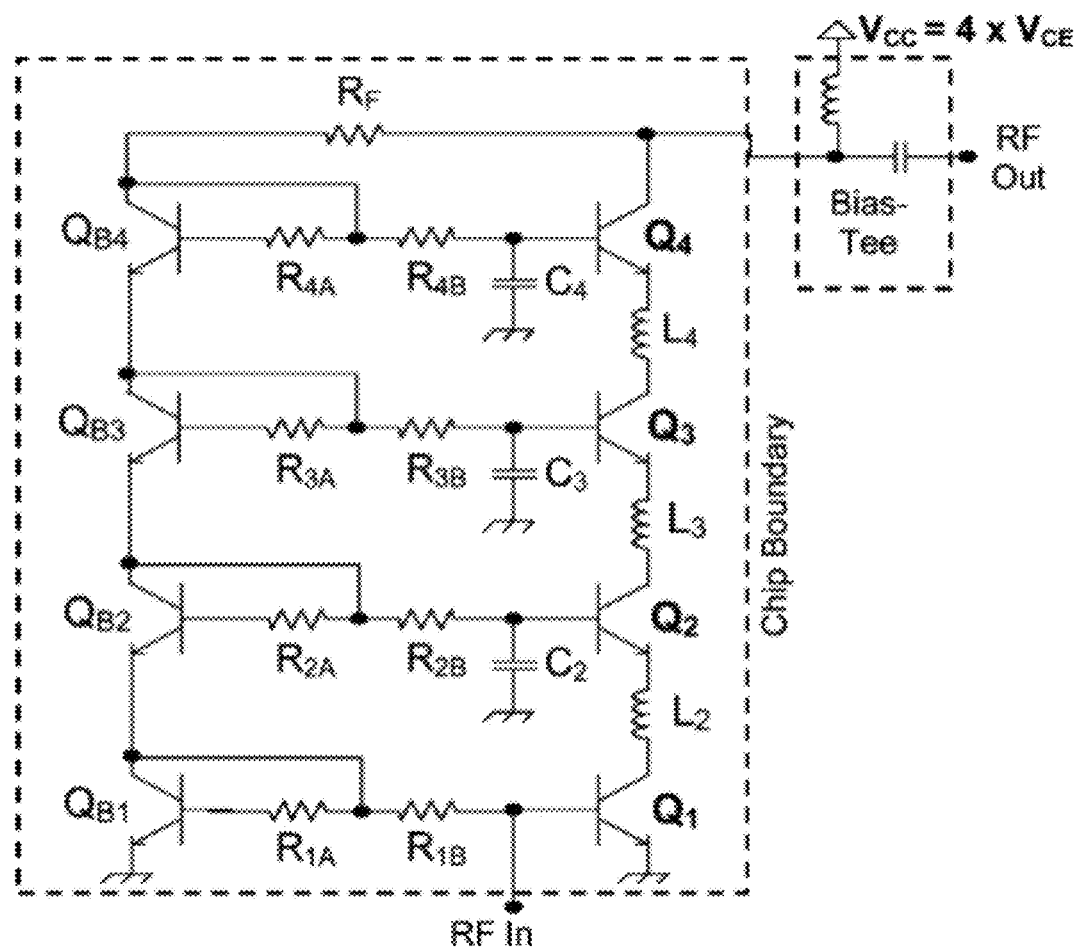
FIG. 8 is a schematic of four-HBT-high SiGe HiVP (sizes in Table 1).

FIG. 8 shows the schematic for the HiVP implemented in this work. From a DC perspective, HBTs $Q_{(1-4)}$ are stacked to allow the bias voltage, $V_{CC}$, to be equal to $4 \times V_{CE}$. HBTs $QB_{(1-4)}$, along with $R_{1-4\ (A\ \&\ B)}$, serve as resistor-ratioed current mirrors to bias the base's of HBTs $Q_{(1-4)}$. From an RF perspective, capacitors $C_{(2-4)}$ and inductors $L_{(2-4)}$, allow one to tune the emitter impedance of $Q_{(2-4)}$. The goal is to allow each HBT $Q_{(2-4)}$ to provide the optimal power match for its preceding HBT. Once properly matched, the maximum RF output voltage swing of the entire stack will be $\sim 2 \times (4 < [V_{CE} - V_{KNEE}])$. The relationship between the base capacitor and its effect on emitter impedance is discussed in [4]-[8].

TABLE I

COMPONENT VALUES USED IN THIS IMPLEMENTATION

| Schematic Label | Relevant Properties |
|---|---|
| $Q_1/Q_2/Q_3/Q_4$ | Emitter Area: 120 nm × 18 μm, 6-fingers |
| $Q_{B1}/Q_{B2}/Q_{B3}/Q_{B4}$ | Emitter Area: 120 nm × 18 μm, 1-finger |
| $C_2/C_3/C_4$ | 500 fF/210 fF/181 fF (A1 MIMCAP) |
| $L_2/L_3/L_4$ | 15 pH (Metal Layer 7) |
| $R_{1A}/R_{2A}/R_{3A}/R_{4A}$ | 3 kΩ (P+ polysilicon resistors, 51% tol.) |
| $R_{1B}/R_{2B}/R_{3B}/R_{4B}$ | 500 Ω (P+ polysilicon resistors, 51% tol.) |
| $R_F$ | 30 Ω (TaN BEOL resistor 8% tol.) |
| $V_{CC}/I_C$ | 5.0 V/91.5 mA (measured) |

Transistor Selection and Initial Calculations

The HiVP architecture can be used with multi-fingered or paralleled HBT devices. In this work, HBT's (1-4) have six fingers each, essentially placing six HBTs in parallel. In the SiGe process used here, a single high-$f_T$ with the largest possible emitter area (120 nm×18 μm), has an optimal output impedance of ~50Ω at 30 GHz. If six HBTs are placed in parallel, their combined optimal impedance drops to ~8.3Ω. Thus the initial calculation of (4×8.3) Ω is made as the optimal output impedance of four stacked six-finger SiGe HBT devices. By properly sizing both the width (# of devices in parallel) and the height of the HiVP (# of devices stacked) to a first degree, one can customize the bias, output impedance, output voltage and current swing of the stack.

Inter-Stack Matching at Millimeter-Wave

The simulation technique outlined above and in [8] was used as a basis for this 30 GHz design. However, the inter-stack matching technique called for additional refinement due to the center frequency being in the millimeter-wave band. The optimal impedance for the $1^{st}$ HBT in the stack was found through simulation to be $Z_{OPT1}=8.52+j6.99\Omega$. The emitter impedance for the $2^{nd}$ stacked device was found to be $Z_{EMITTER2}=22.63+j13.72\Omega$. Using the $Z_{EMITTER}/C_{BASE}$ equation given in [8], $C_2=500$ fF was used to decrease $Z_{EMITTER2}$ to $8.52+j.505\Omega$. A series 15 pH inductor, $L_2$, was added as shown in FIG. 8, to increase the imaginary component of the impedance to make $Z_{EMITTER2}=8.52+j6.99\Omega$, the optimal impedance for the $1^{st}$ stage. The addition of a series inductor was necessary at each stage to match the optimal impedances at 30 GHz.

Figure 9:
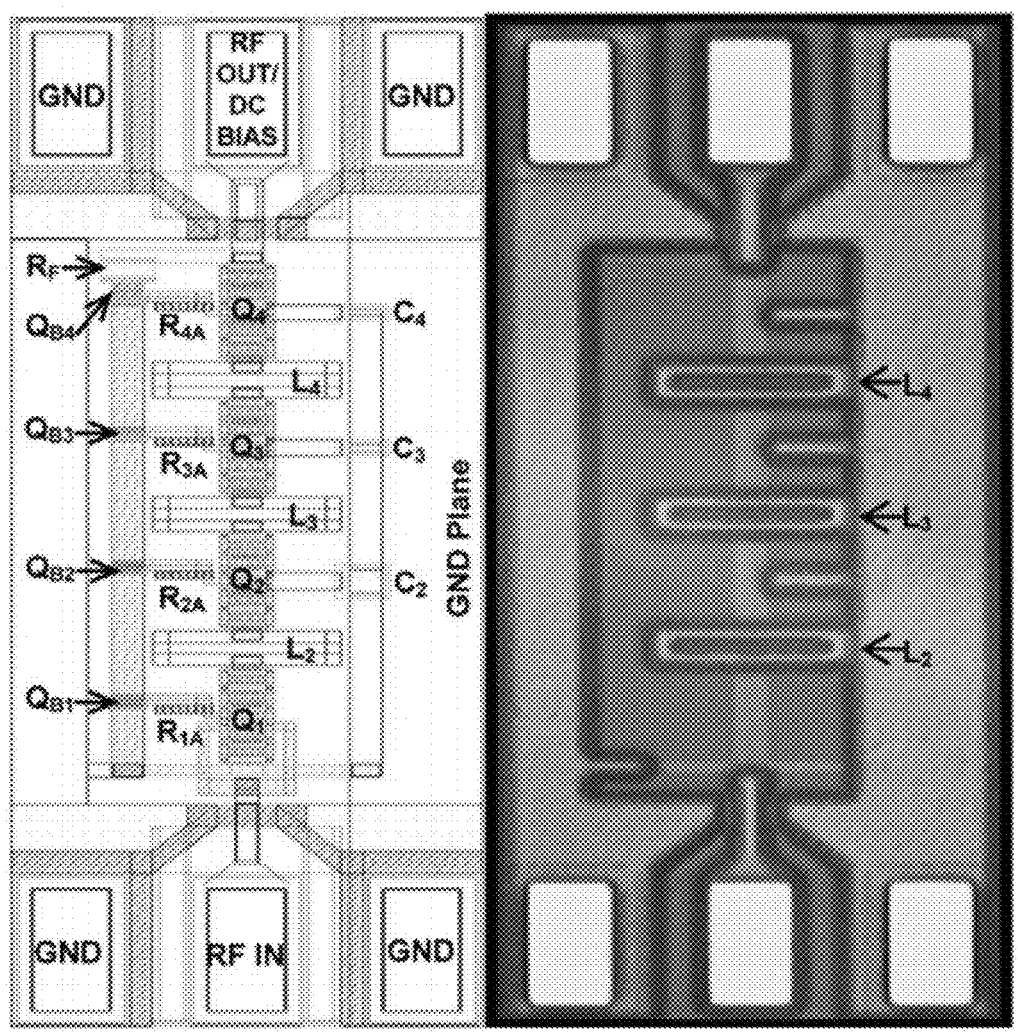
FIG. 9 is an implementation of FIG. 8 with an area of 268 μm×785 μm (sizes in Table 1).

At 30 GHz, the sizes required for $L_2$-$L_4$, 15 pH, were implemented as short lengths of metal lines as shown in FIG. 9. The Sonnet EM analysis tool was used to determine the length of metal line required to provide the simulated values of inductance for $L_2$-$L_4$. The thickest layer of metal was used to create two line lengths (without metal underneath) to create 30 pH of inductance. To reduce ohmic losses and ensure symmetry, two 30 pH lines were placed in parallel to insert 15 pH of inductance between each HBT in the stack.

Figure 10:
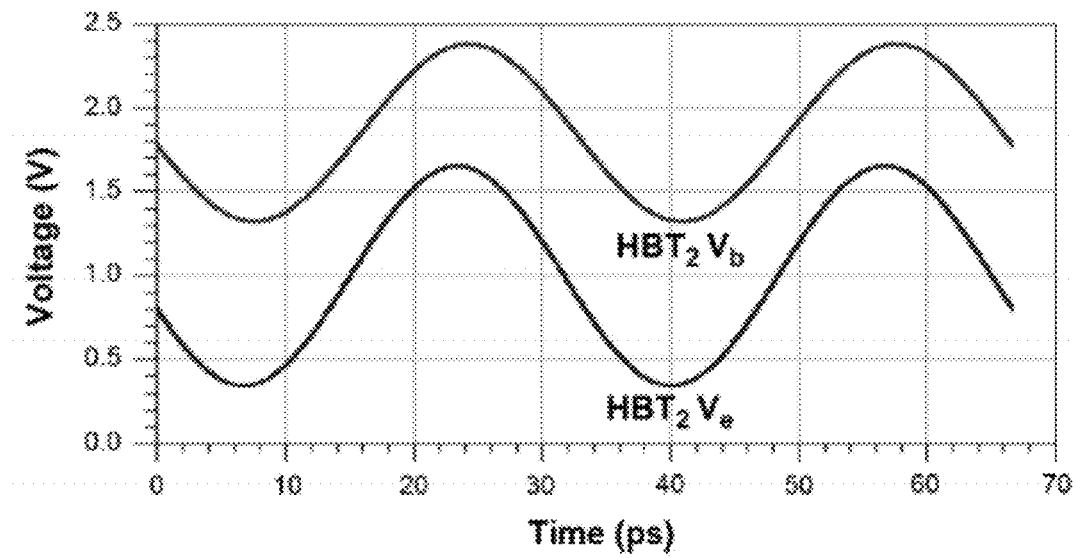
FIG. 10 is a dynamic load line simulation at 30 GHz for four-stack HBT HiVP.

The addition of the inductors, greater number of fingers, and longer negative feedback path, the possibility of phase differences in the RF signals reaching the input terminals of the HBTs becomes a concern at 30 GHz. FIG. 10 shows the RF signals at the base and emitter of $HBT_2$. A phase delay of 0.66 ps, only 3 degrees of phase difference, is observed between the two signals ensuring the HBT's inputs are in phase and avoids a breakdown. The simulation was performed post layout and the design's netlist was broken into separate pieces to add the inter-stage inductance using the results of the EM simulation. $HBT_{3-4}$ were similarly in phase as in the case of $HBT_2$.

Transistor Biasing and RF Feedback Path

As HBT devices are current controlled and highly sensitive to voltage control, a resistor ladder was not appropriate to bias the devices as done in [4]. A resistor-ratioed current mirror stack shown on the left in FIG. 8 provides base current bias and RF feedback. The biasing transistors: $Q_{B1}$-$Q_{B4}$ have $\frac{1}{6}$ the area of stack transistors $Q_1$-$Q_4$. Resistors $R_{1-4(A\ \&\ B)}$ also in $\frac{1}{6}$ ratio, allow greater tolerance to fabrication errors. However, a high precision (+/−4.8Ω/□) tantalum nitride (TaN) resistor was used for resistor $R_F$, as it is not in ratio. Resistor $R_F$ not only supplies negative feedback, but ensures that as the RF output voltage swings up and down, the current supply to the ratioed mirror stack will also swing up and down ensuring the $BV_{CEO}$ and $BV_{CBO}$ is not exceeded for any of the stack transistors protecting them from breaking down.

SiGe HBT HiVP Final Simulations and Layout

Figure 11:
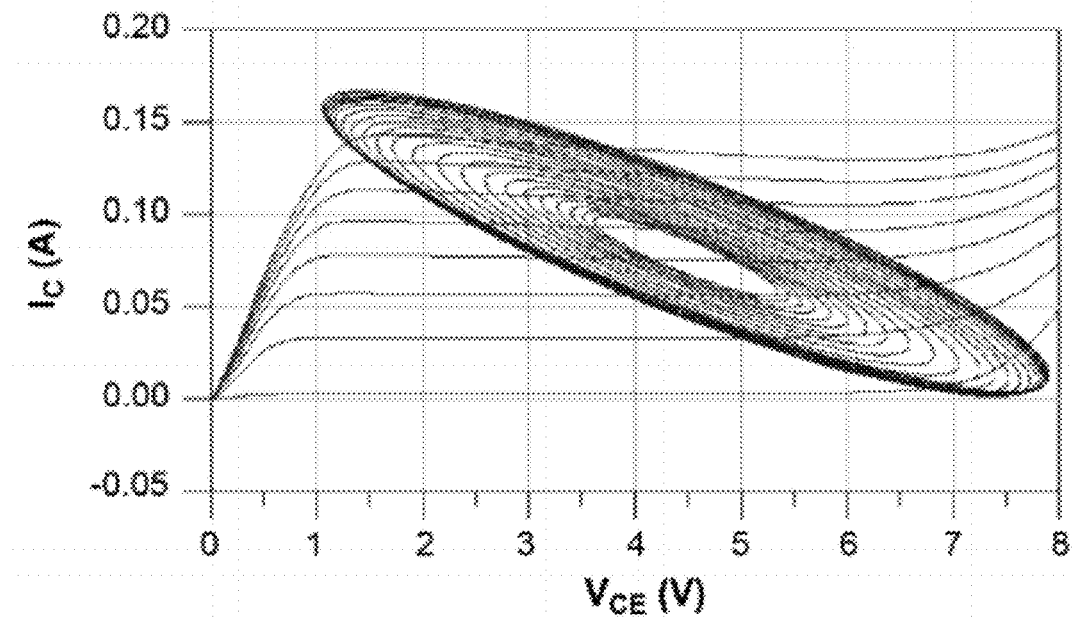
FIG. 11 is a simulated (top) vs. measured (bottom) measurements at 30 GHz.

The simulated dynamic load line shown in FIG. 11 shows both the current and voltage swing for the extracted layout of the SiGe HiVP stack in FIG. 9, with an optimally matched load at 30 GHz without pad effects. The current swings from 0 to ~150 mA, while the voltage swings from ~1 V to ~8 V. For a single six-finger SiGe HBT, the current swing is identical, but the voltage swings from only ~0.5 V to ~2.0 V without breaking down. The four-stack HiVP has roughly four times the voltage swing of a single six-finger HBT which leads to the nearly four times the RF output power in this implementation.

Implementation and Measurements

Figure 12A:
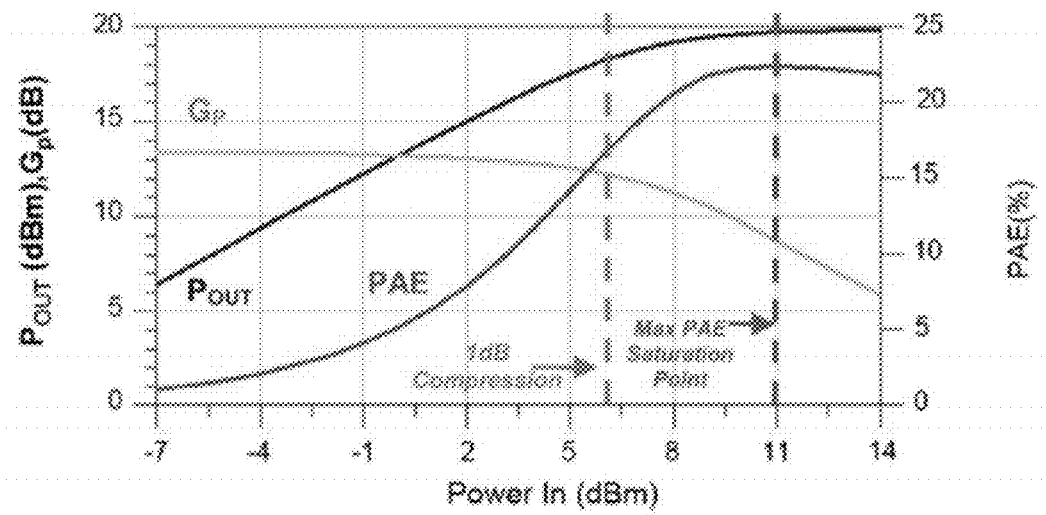
FIG. 12 is a simulated (solid lines) vs. measured (non-solid lines) S-parameters.
Figure 12B:
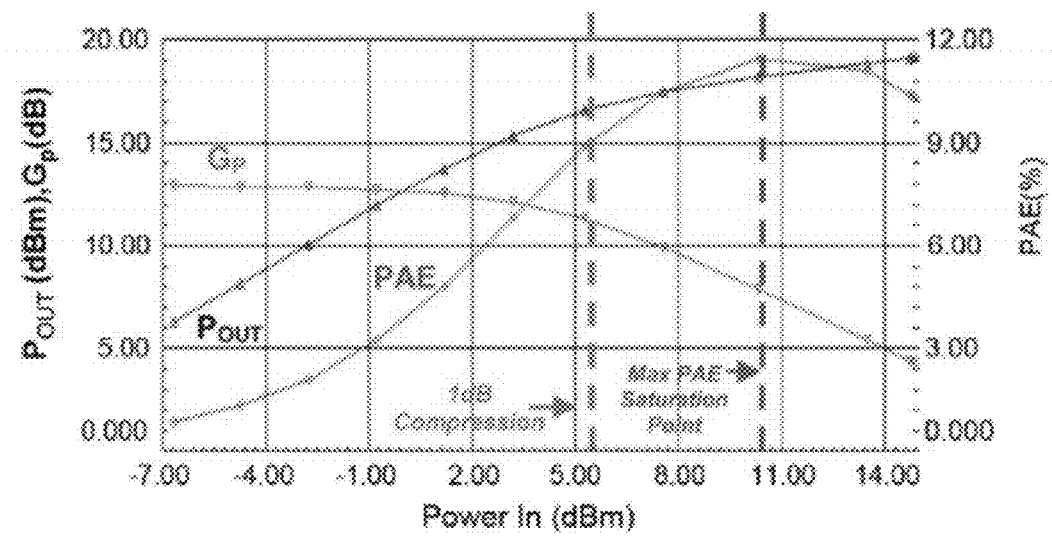
Figure 13:
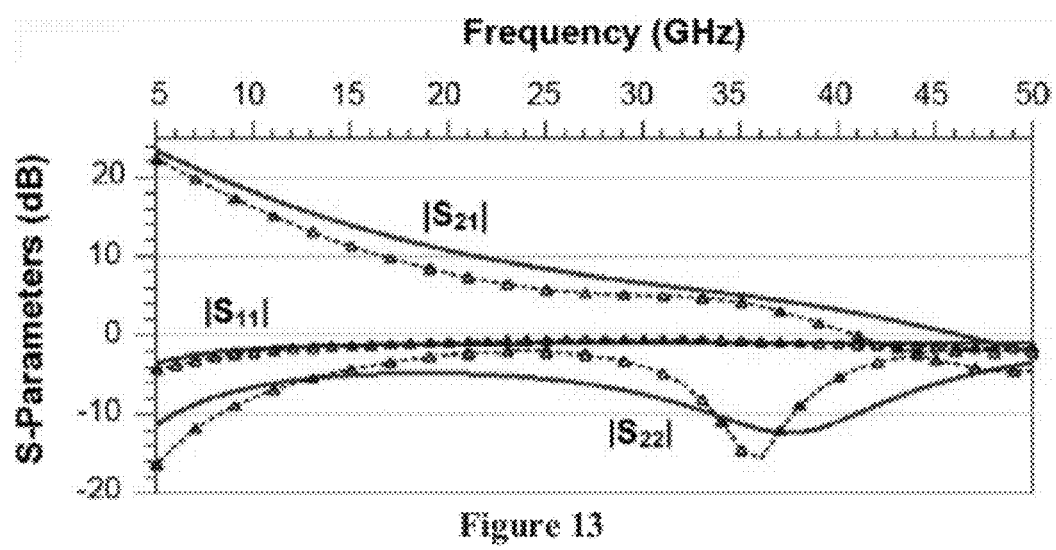

Fabricated in a commercial 120 nm seven-metal layer SiGe HBT BiCMOS process the final area, without probe-pads, was 0.21 mm². A load-pull probe-station was used to determine the optimal source and load impedances to maximize gain and output power. With the optimal impedances presented to the four-HBT-high HiVP ($Z_S=8.77-j\ 10.6\Omega$ and $Z_L=18.6+j\ 3.37\Omega$), a $P_{SAT}=19.0$ dBm with PAE=11.47%. $P_{1dB}=16.58$ dBm with PAE=8.89% was also measured with the optimal impedances presented. The difference between the simulated and measured optimal impedances is due to the difference in the plane of reference and the effects of the probe pads. The simulated versus measured characteristics are shown in FIGS. 12(a), (b) and 13, where $V_{CC}=5.0$ V, $I_C=91.5$ mA.

While the height and width of the HiVP circuit could have been customized to reach 50Ω, the intent of this work was to create a unit cell design with a custom impedance for insertion into a larger power combining structure in future work.

Table II shows a comparison of this work to other K-band power amplifiers in silicon technologies (RF-CMOS and SiGe). To this author's knowledge, this work represents the highest power density reported for any silicon-based PA implementation currently in the literature, and is competitive with other silicon PAs in the K-band. This SiGe HBT HiVP has been designed for 30 GHz operation—a frequency of interest. Instead of 30 GHz, this work can be used for applications in the Ka-band, such as those noted at http://en.wikipedia.org/wiki/Ka_band, which is hereby incorporated by reference.

TABLE II

COMPARISON OF SI-BASED K-BAND PAS WO/COMBINERS

| Freq. [GHz] | Small Sig. gain [dB] | P1dB [dBm] | Psat [dBm] | Peak PAE [%] | Ref. |
|---|---|---|---|---|---|
| 24 | 7.0 | ~13.0 | 14.5 | 11.0 | [9] |
| 24 | 18.8 | 13.3 | 19.1 | 15.6 | [10] |
| 27 | 17.0 | 12.0 | 14.0 | N/A | [11] |
| 30 | 13.0 | 16.58 | 19.0 | 11.47 | This work |
| 40 | 7.0 | ~9.0 | 10.4 | N/A | [11] |

CONCLUSION

This work represents the first implementation of the HiVP architecture at a millimeter-wave frequency. It is meant to serve as a proof-of-concept that the HiVP architecture can be implemented in silicon-based technologies to improve the output power of silicon-based power amplifiers without the need for lossy and bulky power combining structures. It is also meant to provide a technique for decreasing total chip area, increasing output impedance to simplify or eliminate device matching, and to customize bias voltage for silicon PAs, to allow for replacement of some III-V PAs in existing millimeter-wave systems.

The invention can be implemented for a amplifier component (such as a power amplifier, low noise amplifier, small signal amplifier, variable gain amplifier, voltage controlled oscillator) in a transmitter and/or receiver of the chips powering radar systems, medical or security image scanning systems, and/or high speed wired or wireless systems. The amplifier can also be integrated in a computer or computing device that performs various functions and operations. Frequencies if operation in any of these areas cover the entire RF range, but most specifically fit in the millimeter-wave band of frequencies.

The following publications, some of which are referenced above, are incorporated herein by reference in their entireties: [1] A. Babakhani, X. Guan, A. Komijani, A. Natarajan, A. Hajimiri, "A 77-GHz Phased-Array Transceiver with On-Chip Antennas in Silicon: Receiver and Antennas", *IEEE Journal of Solid-State Circuits*, Vol. 41, No. 12, pp. 2795-2806, December 2006; [2] B. Floyd, U. Pfeiffer, S. Reynolds, A. Valdes-Garcia, C. Haymes, Y. Katayamat, et al., "Silicon Millimeter-Wave Radio Circuits at 60-100 GHz," *Proc. IEEE Topical Meeting on Silicon Monolithic Integrated Circuits in RF Systems*, pp. 213-218, January 2007; [3]J. Rieh, D. Greenberg, A. Stricker, G. Freeman, "Scaling of SiGe HBTs", *Proc. of the IEEE*, Vol. 93, No. 9, pp. 1522-1538, September 2005; [4]A. K. Ezzeddine and H. C. Huang, "The High Voltage/High Power FET (HiVP)," *IEEE RFIC Symposium Digest*, pp. 215-218, June 2003; [5] L. Wu, R. Tao, U. Basaran, J. Luger, I. Dettmann, M. Berroth, "The Integrated 2 W High Voltage/High Power 0.12-µm RF CMOS Power Amplifier," *12th GAAS Symposium—Amsterdam*, pp. 451-454, 2004; [6]M. Lei, Z. Tsai, K. Lin, H. Wang, "Design and Analysis of Stacked Power Amplifier in Series-Input and Series-Output Configuration," *IEEE Tran. on Microwave Theory and Techniques*, Vol. 55, No. 12, pp. 2802-2812, December 2007; [7]H. Wang, K. Lin, Z. Tsai, L. Lu, H. Lu, C. Wang, et al., "MMICs in the Millimeter-wave Regime," *Microwave Magazine, IEEE*, vol. 10, no. 1, pp. 99-117, February 2009; [8] Farmer, T. J., Darwish, A., Zaghloul, M. E., "A 2.4 GHz SiGe HBT High Voltage/High Power Amplifier," *Microwave and Wireless Components Letters, IEEE*, vol. 20, no. 5, pp. 286-288, May 2010; [9] A. Komijani, A. Natarajan, and A. Hajimiri, "A 24-GHz, +14.5-dBm fully integrated power amplifier in 0.18 µm CMOS," *IEEE Solid-State Circuits*, vol. 40, no. 9, pp. 1901-1908, September 2005; [10] J. Kuo, Z Tsai, H. Wang, "A 19.1-dBm Fully-Integrated 24 GHz Power Amplifier Using 0.18-µm CMOS Technology," *Microwave Integrated Circuit Conference*, 2008. EuMIC 2008. European, vol., no., pp. 558-561, 27-28 Oct. 2008; [11] H. Shigematsu, T. Hirose, F. Brewer, M. Rodwell, "Millimeter-Wave CMOS Circuit Design," Microwave and Wireless Components Letters, IEEE, vol. 53, no. 2, pp. 472-477, February 2005; [12]"Millimeter-Wave High Voltage Power Amplifier Implementation in Silicon Germanium" by Thomas Joseph Farmer; [13] Farmer, T. J., Darwish, A., Zaghloul, M. E., "High Voltage/High Power Amplifier Implementation with 0.12 µm SiGe HBTs," Proceedings of the 2010 GOMAC-Tech—Government Microcircuit Applications and Critical Technology Conference Microelectronics for Net Enabled and Cyber Transformational Technologies, Reno, Nev., Mar. 23-25, 2010; [14] Farmer, T. J., Darwish, A., Viveiros, E., Flung, H. Alfred, Zaghloul, M. E., "Device Architecture for Millimeter-Wave Power Amplifiers using SiGe HBTs," Proceedings of the 2011 GOMAC-Tech—Government Microcircuit Applications and Critical Technology Conference Microelectronics for Net Enabled and Cyber Transformational Technologies, Orlando, Fla., Mar. 21-24, 2011; [15] Farmer, T. J., Darwish, A., Viveiros, E., Hung, H. Alfred, Zaghloul, M. E., "SiGe HBT Stacked Power Amplifier at Millimeter-Wave," Proceedings of the 2011 GOMAC-Tech—Government Microcircuit Applications and Critical Technology Conference Microelectronics for Net Enabled and Cyber Transformational Technologies, Orlando, Fla., Mar. 21-24, 2011; [16] Farmer, T. J., Darwish, A., Huebschman, B., Viveiros, E., Hung, A., Zaghloul, M. E., "Millimeter-wave SiGe High Voltage/High Power Architecture Implementation," Microwave and Wireless Components Letters, IEEE, vol. 21, no. 10, pp. 544-546, October 2011; [17] Farmer, T. J., Darwish, A., Huebschmnan, B., Viveiros, E., Hung, A., Zaghloul, M. E., "High Power Density SiGe Millimeter-Wave Power Amplifiers," International Journal of Microwave and Wireless Technologies, vol. 3, no. 6, pp 615-620, December 2011.

The description and drawings of the present invention provided here is illustrative only of the principles of the invention. The invention may be configured in a variety of ways and is not intended to be limited by the preferred embodiment. Numerous applications of the invention to will readily occur to those skilled in the art. Therefore, it is not desired to limit the invention to the specific examples disclosed or the exact construction and operation shown and described. Rather, all suitable modifications and equivalents may be resorted to, falling within the scope of the invention.

The invention claimed is:

1. An amplifier comprising:
   a plurality of ratioed current mirrors connected to each other, each ratio mirror having at least two resistors, a first bipolar transistor and a second bipolar transistor connected to the first bipolar transistor via said at least two resistors, wherein the first bipolar transistor of one of the plurality of ratioed current mirrors sets the DC bias for the second bipolar transistor of said one of the plurality of ratioed current mirrors which provides RF amplification at a set DC bias level, and wherein said first transistors of the plurality of current mirrors form a stacked configuration having an output, and said second transistors of the plurality of current mirrors have a DC biasing input; and
   a feedback pathway connecting the output of the stacked configuration with the DC biasing input, wherein said feedback pathway provides negative RF feedback and variable dc bias control.

2. The amplifier of claim 1, wherein at least one of said plurality of ratioed current mirrors further comprises an RF matching capacitor.

3. The amplifier of claim 1, wherein said at least two resistors comprises a first resistor and a second resistor coupled with said at least two bipolar transistors, wherein said first and second resistors bias said at least two bipolar transistors.

4. The amplifier of claim 1, wherein said feedback pathway comprises a reference resistor connected to said first bipolar transistor and said second bipolar transistor.

5. The amplifier of claim 4, wherein said reference resistor changes a reference current to each of said plurality of ratioed current mirrors.

6. The amplifier of claim 1, further comprising a connecting wire having one end connected to a top of one of the at least two bipolar transistors and an opposite end connected between the at least two resistors, said connecting wire carrying an input current.

7. The amplifier of claim 6, wherein said input current is split across each of the at least two resistors.

8. The amplifier of claim 7, wherein a current across one of the at least two resistors is larger than a current across the other of the at least two resistors.

9. A circuit for providing amplification of a radio (RF) frequency signal, comprising:
   a first ratioed current mirror comprising a first bipolar transistor, a first resistor, a second resistor, and a second bipolar transistor, wherein said first bipolar transistor is connected with said first resistor, said first resistor is connected with said second resistor, and said second resistor is connected with said second bipolar transistor;
   a second ratioed current mirror comprising a third bipolar transistor, a third resistor, a fourth resistor, and a fourth bipolar transistor, wherein said third bipolar transistor is connected with said third resistor, said third resistor is connected with said fourth resistor, and said fourth resistor is connected with said fourth bipolar transistor;
   wherein said first ratioed current mirror is connected with said second ratioed current mirror whereby said first bipolar transistor is connected to said third bipolar transistor and said second bipolar transistor is connected to said fourth bipolar transistor; and wherein said third bipolar transistor forms an output and said fourth bipolar transistor forms an input; and a feedback pathway connected to the output and the input, wherein said feedback pathway provides negative feedback and variable dc bias control.

10. The circuit of claim 9, wherein said feedback pathway comprises a reference resistor.

11. The circuit of claim 10, wherein said reference resistor changes a reference current to each of said plurality or ratioed current mirrors.

12. A circuit for providing amplification of a radio (RF) frequency signal, comprising:

a first ratioed current mirror comprising a first bipolar transistor, a first resistor, a second resistor, and a second bipolar transistor, wherein said first bipolar transistor is connected with said first resistor, said first resistor is connected with said second resistor, and said second resistor is connected with said second bipolar transistor;

a second ratioed current mirror comprising a third bipolar transistor, a third resistor, a fourth resistor, and a fourth bipolar transistor, wherein said third bipolar transistor is connected with said third resistor, said third resistor is connected with said fourth resistor, and said fourth resistor is connected with said fourth bipolar transistor;

wherein said first ratioed current mirror is connected with said second ratioed current mirror whereby said first bipolar transistor is connected to said third bipolar transistor and said second bipolar transistor is connected to said fourth bipolar transistor; and an RF matching capacitor connected between said fourth resistor and said fourth bipolar transistor.

13. The circuit of claim 12, wherein said second bipolar transistor, said fourth bipolar transistor and said RF matching capacitor form an amplification circuit which amplifies the RF signal; and said first bipolar transistor, said second bipolar transistor, said first resistor, said second resistor, said third resistor, and said fourth resistor form a bias circuit to provide current to operate said amplification circuit.

14. A circuit for providing amplification of a radio (RF) frequency signal, comprising:

a first ratioed current mirror comprising a first bipolar transistor, a first resistor, a second resistor, and a second bipolar transistor, wherein said first bipolar transistor is connected with said first resistor, said first resistor is connected with said second resistor, and said second resistor is connected with said second bipolar transistor;

a second ratioed current mirror comprising a third bipolar transistor, a third resistor, a fourth resistor, and a fourth bipolar transistor, wherein said third bipolar transistor is connected with said third resistor, said third resistor is connected with said fourth resistor, and said fourth resistor is connected with said fourth bipolar transistor;

wherein said first ratioed current mirror is connected with said second ratioed current mirror whereby said first bipolar transistor is connected to said third bipolar transistor and said second bipolar transistor is connected to said fourth bipolar transistor;

said first bipolar transistor has a first base, a first emitter and a first collector;

said second bipolar transistor has a second base, a second emitter and a second collector;

said third bipolar transistor has a third base a third emitter and a third collector;

said fourth bipolar transistor has a fourth base, a fourth emitter and a fourth collector;

wherein the first base is connected to said first resistor, the second base is connected to said second resistor, the third base is connected to said third resistor and the fourth base is connected to said fourth resistor; and wherein the first collector is connected to the third emitter, and the second collector is connected to the fourth emitter.

15. The circuit of claim 12, further comprising a reference resistor having one end connected to said third collector and an opposite end connected to said fourth collector, wherein said reference resistor provides negative feedback and variable dc bias control.

16. The circuit of claim 15, wherein said reference resistor changes a reference current to said first, second, third and fourth bipolar transistors.

17. The amplifier of claim 14, further comprising a first connecting wire carrying a first input current and having one end connected to the first collector and an opposite end connected between the first and second resistors, a second connecting wire carrying a second input current and having one end connected to the third collector and an opposite end connected between the third and fourth resistors.

18. The amplifier of claim 17, wherein said first input current is split across the first and second resistors to provide a respective first and second resistor current, and the second input current is split across the third and fourth resistors to provide a respective third and fourth resistor current.

19. The amplifier of claim 18, wherein the second resistor current is greater than the first resistor current and the fourth resistor current is greater than the third resistor current.

20. The amplifier of claim 18, wherein the first resistor current is less than the second resistor current and the fourth resistor current is greater than the third resistor current.

21. The amplifier of claim 1, wherein said feedback pathway comprises an impedance device.

22. The amplifier of claim 9, wherein said feedback pathway comprises an impedance device.

23. The amplifier of claim 1, wherein the negative feedback comprises negative RF feedback.

24. The amplifier of claim 1, wherein the second bipolar transistors provide amplification.

* * * * *

UNITED STATES PATENT AND TRADEMARK OFFICE
CERTIFICATE OF CORRECTION

PATENT NO. : 8,791,759 B2
APPLICATION NO. : 13/427311
DATED : July 29, 2014
INVENTOR(S) : Ali Darwish et al.

It is certified that error appears in the above-identified patent and that said Letters Patent is hereby corrected as shown below:

On the Title Page of the patent, item (75), please change the inventor's name as follows:

delete "Thomas J. Farm" and insert --Thomas J. Farmer--.

Signed and Sealed this
Eighteenth Day of November, 2014

Michelle K. Lee
*Deputy Director of the United States Patent and Trademark Office*